United States Patent
Li et al.

(10) Patent No.: US 9,548,096 B1
(45) Date of Patent: Jan. 17, 2017

(54) REVERSE COMPLEMENT MAGNETIC TUNNEL JUNCTION (MTJ) BIT CELLS EMPLOYING SHARED SOURCE LINES, AND RELATED METHODS

(71) Applicant: QUALCOMM Incorporated, San Diego, CA (US)

(72) Inventors: Xia Li, San Diego, CA (US); Yu Lu, San Diego, CA (US); Xiaochun Zhu, San Diego, CA (US)

( * ) Notice: Subject to any disclaimer, the term of this patent is extended or adjusted under 35 U.S.C. 154(b) by 0 days.

(21) Appl. No.: 14/835,871

(22) Filed: Aug. 26, 2015

(51) Int. Cl.
*G11C 11/00* (2006.01)
*G11C 11/16* (2006.01)

(52) U.S. Cl.
CPC .......... *G11C 11/1673* (2013.01); *G11C 11/161* (2013.01); *G11C 11/1675* (2013.01)

(58) Field of Classification Search
CPC . G11C 11/1673; G11C 11/161; G11C 11/1675
USPC .................................. 365/158, 200
See application file for complete search history.

(56) References Cited

U.S. PATENT DOCUMENTS

| | | | |
|---|---|---|---|
| 6,169,689 B1 * | 1/2001 | Naji | G11C 11/15 365/173 |
| 6,958,502 B2 * | 10/2005 | Lu | B82Y 10/00 257/295 |
| 7,075,818 B2 * | 7/2006 | Ju | G11C 11/16 365/158 |
| 7,995,378 B2 | 8/2011 | Yoon et al. | |
| 8,208,290 B2 | 6/2012 | Rao et al. | |
| 9,196,338 B2 * | 11/2015 | Kawasumi | G11C 11/1673 |
| 2010/0302838 A1 | 12/2010 | Wang et al. | |
| 2011/0122674 A1 | 5/2011 | Lin et al. | |
| 2011/0222334 A1 | 9/2011 | Aoki | |
| 2013/0272059 A1 | 10/2013 | Lin et al. | |
| 2013/0322161 A1 | 12/2013 | Noguchi et al. | |
| 2014/0146599 A1 | 5/2014 | Romanovskyy | |
| 2015/0357376 A1 | 12/2015 | Seo et al. | |

FOREIGN PATENT DOCUMENTS

JP 2013131271 A 7/2013

OTHER PUBLICATIONS

International Search Report and Written Opinion for PCT/US2016/046227, mailed Nov. 3, 2016, 17 pages.

* cited by examiner

*Primary Examiner* — Pho M Luu
(74) *Attorney, Agent, or Firm* — Withrow & Terranova, PLLC

(57) ABSTRACT

Reverse complement MTJ bit cells employing shared source lines are disclosed. In one aspect, a 2T2MTJ reverse complement bit cell employing shared source line is provided. Bit cell includes first MTJ and second MTJ. Value of first MTJ is complement of value of second MTJ. First bit line is coupled to top layer of first MTJ, and first electrode of first access transistor is coupled to bottom layer of first MTJ. Second bit line is coupled to bottom layer of second MTJ, and first electrode of second access transistor is coupled to top layer of second MTJ. Word line is coupled to second electrode of first access transistor and second access transistor. Shared source line is coupled to third electrode of first access transistor and second access transistor. Employing shared source line allows the bit cell to be designed with reduced parasitic resistance.

28 Claims, 10 Drawing Sheets

US 9,548,096 B1

REVERSE COMPLEMENT MAGNETIC TUNNEL JUNCTION (MTJ) BIT CELLS EMPLOYING SHARED SOURCE LINES, AND RELATED METHODS

BACKGROUND

I. Field of the Disclosure

The technology of the disclosure relates generally to magnetic tunnel junctions (MTJs), and particularly to the use of MTJ bit cells in magnetic random access memory (MRAM), including two (2) transistor, two (2) MTJ (2T2MTJ) bit cells.

II. Background

Processor-based computer systems include memory for data storage. Memory systems are composed of resistive memory elements capable of storing data, wherein the form of the stored data depends on the type of memory employed. In particular, magnetic random access memory (MRAM) is an example of non-volatile memory in which data is stored by programming a magnetic tunnel junction (MTJ) of an MRAM bit cell. Data is stored in an MTJ as a magnetic state, wherein no electric current is required to preserve a stored data value. Thus, an MTJ can store data even when power is not supplied to the MTJ (e.g., the MTJ is non-volatile). Conversely, memory that stores data in the form of an electric charge, such as static random access memory (SRAM), requires power to preserve a stored data value (e.g., such memory is volatile). Thus, because an MTJ may store information even when power is turned off, particular circuits and systems may benefit from employing MRAM.

In this regard, FIG. 1 illustrates an exemplary MRAM bit cell 100 that includes a metal-oxide semiconductor (MOS) (typically n-type MOS, i.e., NMOS) access transistor 102 integrated with an MTJ 104 for storing non-volatile data. The MRAM bit cell 100 may be provided in an MRAM memory used as memory storage for any type of system requiring electronic memory, such as a central processing unit (CPU) or processor-based system, as examples. The MTJ 104 includes a pinned layer 106 and a free layer 108 disposed on either side of a tunnel barrier 110 formed by a thin non-magnetic dielectric layer. When the magnetic orientation of the pinned layer 106 and the free layer 108 are anti-parallel (AP) to each other, a first memory state exists (e.g., a logical '1'). When the magnetic orientation of the pinned layer 106 and the free layer 108 are parallel (P) to each other, a second memory state exists (e.g., a logical '0'). Further, the access transistor 102 controls reading and writing data to the MTJ 104. A drain (D) of the access transistor 102 is coupled to a bottom electrode 112 of the MTJ 104, which is coupled to the pinned layer 106. A word line 114 is coupled to a gate (G) of the access transistor 102. A source (S) of the access transistor 102 is coupled to a source line 116. A bit line 118 is coupled to a top electrode 120 of the MTJ 104, which is coupled to the free layer 108.

To read data stored in the MRAM bit cell 100, the resistance (R) of the MRAM bit cell 100 is measured. In particular, the word line 114 activates the access transistor 102 to allow current (I) to flow through the MTJ 104 between the bottom electrode 112 and the top electrode 120. The resistance (R) is measured by dividing a voltage (V) of the bit line 118 by the current (I) flowing between the bottom and top electrodes 112, 120. A lower resistance (R) is associated with a P orientation between the pinned layer 106 and the free layer 108. A higher resistance (R) is associated with an AP orientation between the pinned layer 106 and the free layer 108. Reading the MRAM bit cell 100 in this manner is not immediate, but rather such a read operation requires a certain amount of time to measure the resistance (R). As a non-limiting example, certain MRAM bit cells similar to the MRAM bit cell 100 require approximately five (5) nanoseconds (ns) of read sensing time to perform a read operation. However, certain circuits, such as a level two (L2) cache memory may require a faster read sensing time, such as three (3) ns, for example. Thus, it would be advantageous if MRAM bit cells could be provided that have a reduced read sensing time as compared to the MRAM bit cell 100.

In this regard, FIG. 2 illustrates an exemplary two (2) transistor, two (2) MTJ (2T2MTJ) bit cell 200. The 2T2MTJ bit cell 200 achieves a reduced read sensing time as compared to the read sensing time of the one (1) transistor MRAM bit cell 100 in FIG. 1. The 2T2MTJ bit cell 200 includes a first MTJ 202 and a second MTJ 204, wherein a first value stored in the first MTJ 202 is a complement of a second value stored in the second MTJ 204. A first bit line 206 is coupled to a free layer 208 of the first MTJ 202, and a drain (D) of a first access transistor 210 is coupled to a pinned layer 212 of the first MTJ 202. A tunnel barrier 213 is disposed between the free layer 208 and the pinned layer 212. A first source line 214 is coupled to a source (S) of the first access transistor 210. Similarly, a second bit line 216, which is a complement of the first bit line 206, is coupled to a free layer 218 of the second MTJ 204, and a drain (D) of a second access transistor 220 is coupled to a pinned layer 222 of the second MTJ 204. A tunnel bather 223 is disposed between the free layer 218 and the pinned layer 222. A second source line 224 is coupled to a source (S) of the second access transistor 220. A word line 226 coupled to a gate (G) of the first access transistor 210 and a gate (G) of the second access transistor 220 is activated to access the first MTJ 202 and the second MTJ 204.

With continuing reference to FIG. 2, to read the 2T2MTJ bit cell 200, the word line 226 activates the first and second access transistors 210, 220. A current (I) is generated that flows from the first source line 214 through the first MTJ 202 to the first bit line 206. A current (I) is also generated that flows from the second source line 224 through the second MTJ 204 to the second bit line 216. Rather than measuring the resistance (R) of the first MTJ 202 and the second MTJ 204 similar to reading the MRAM bit cell 100 in FIG. 1, the voltage (V) of the first MTJ 202 and the voltage (V) of the second MTJ 204 are provided to a sensing device, such as a differential operational amplifier (not shown). Such a sensing device determines the logical value stored in the first MTJ 202 based on the difference in voltages (V) of the first MTJ 202 and the second MTJ 204. Reading the 2T2MTJ bit cell 200 in this manner has a reduced read sensing time as compared to that of the MRAM bit cell 100. However, the additional circuit elements of the 2T2MTJ bit cell 200, such as the second bit line 216 and the second source line 224, may lead to more complex fabrication routing, and thus, higher parasitic resistance. Such a higher parasitic resistance may limit the speed of the read sensing time of the 2T2MTJ bit cell 200. Therefore, it would be advantageous to achieve the reduced read sensing time of the 2T2MTJ bit cell 200 without incurring a higher parasitic resistance.

SUMMARY OF THE DISCLOSURE

Aspects disclosed in the detailed description include reverse complement magnetic tunnel junction (MTJ) bit cells employing shared source lines, and related methods. In certain aspects disclosed herein, two (2) transistor, two (2) MTJ (2T2MTJ) reverse complement bit cells employing shared source lines are provided rather than employing separate source lines for each MTJ. Employing a single shared source line that is electrically coupled to two (2) MTJs in the 2T2MTJ reverse complement bit cell allows the shared source line to be fabricated with a larger width without increasing die size, as compared to fabricating separate source lines for a conventional 2T2MTJ bit cell. Providing a shared source line with a larger width in a 2T2MTJ bit cell reduces the parasitic resistance of the source line, as compared to a conventional 2T2MTJ bit cell, resulting in reduced read sensing times.

In this regard, in one aspect, a 2T2MTJ reverse complement bit cell employing a shared source line is provided to achieve a reduced read sensing time with a reduced parasitic resistance. The 2T2MTJ reverse complement bit cell includes a first MTJ and a second MTJ, wherein a value represented by a magnetic orientation in the first MTJ is a complement of a value represented by a magnetic orientation in the second MTJ. A first bit line is coupled to a top layer of the first MTJ, and a first electrode of a first access transistor is coupled to a bottom layer of the first MTJ. A second bit line, which is a complement of the first bit line, is coupled to a bottom layer of the second MTJ, and a first electrode of a second access transistor is coupled to a top layer of the second MTJ. Thus, the second MTJ is coupled to the second bit line and the second access transistor in a reverse manner, as compared to how the first MTJ is coupled to the first bit line and the first access transistor. A word line coupled to a second electrode of the first access transistor and a second electrode of the second access transistor is activated to access the first MTJ and the second MTJ. Further, a shared source line is coupled to a third electrode of the first access transistor and a third electrode of the second access transistor. Thus, rather than employing separate source lines for each of the first MTJ and the second MTJ, the first MTJ and the second MTJ share a single source line.

In one aspect, a reverse complement MTJ bit cell is disclosed. The reverse complement MTJ bit cell comprises a first MTJ and a second MTJ. The reverse complement MTJ bit cell further comprises a first electrode of a first access transistor coupled to a bottom layer of the first MTJ, and a first electrode of a second access transistor coupled to a top layer of the second MTJ. The reverse complement MTJ bit cell further comprises a word line coupled to a second electrode of the first access transistor and a second electrode of the second access transistor. The reverse complement MTJ bit cell further comprises a first bit line coupled to a top layer of the first MTJ. The reverse complement MTJ bit cell further comprises a second bit line coupled to a bottom layer of the second MTJ. The reverse complement MTJ bit cell further comprises a shared source line coupled to a third electrode of the first access transistor and a third electrode of the second access transistor.

In another aspect, a method for accessing a reverse complement MTJ bit cell is disclosed. The method comprises providing a first access voltage to a first bit line coupled to a top layer of a first MTJ, wherein the first MTJ further comprises a bottom layer coupled to a first electrode of a first access transistor. The method further comprises providing a second access voltage to a second bit line coupled to a bottom layer of a second MTJ, wherein the second MTJ further comprises a top layer coupled to a first electrode of a second access transistor. The method further comprises providing a source voltage to a shared source line coupled to a third electrode of the first access transistor and a third electrode of the second access transistor. The method further comprises providing an enable voltage to a word line coupled to a second electrode of the first access transistor and a second electrode of the second access transistor.

In another aspect, a reverse complement MTJ bit cell is disclosed. The reverse complement MTJ bit cell comprises a first MTJ and a second MTJ. The reverse complement MTJ bit cell further comprises a first access transistor formed on a substrate, wherein the first access transistor comprises a first electrode electrically coupled to a bottom layer of the first MTJ. The reverse complement MTJ bit cell further comprises a second access transistor formed on the substrate, wherein the second access transistor comprises a first electrode electrically coupled to a top layer of the second MTJ. The reverse complement MTJ bit cell further comprises a word line disposed so as to be electrically coupled to a second electrode of the first access transistor and to a second electrode of the second access transistor. The reverse complement MTJ bit cell further comprises a first bit line disposed in a third metal layer so as to be electrically coupled to a top layer of the first MTJ. The reverse complement MTJ bit cell further comprises a second bit line disposed in a second metal layer so to as to be electrically coupled to a bottom layer of the second MTJ. The reverse complement MTJ bit cell further comprises a shared source line disposed in a first metal layer so as to be electrically coupled to a third electrode of the first access transistor and a third electrode of the second access transistor.

In another aspect, a method of manufacturing a reverse complement MTJ bit cell is disclosed. The method comprises forming a first access transistor on a substrate. The method further comprises forming a second access transistor on the substrate. The method further comprises disposing a word line so as to be electrically coupled to a second electrode of the first access transistor and a second electrode of the second access transistor. The method further comprises disposing a shared source line in a first metal layer such that the shared source line is electrically coupled to a third electrode of the first access transistor and a third electrode of the second access transistor. The method further comprises disposing a first bit line in a third metal layer. The method further comprises disposing a second bit line in a second metal layer. The method further comprises disposing a first MTJ such that a top layer of the first MTJ is electrically coupled to the first bit line and a bottom layer of the first MTJ is electrically coupled to a first electrode of the first access transistor. The method further comprises disposing a second MTJ such that a top layer of the second MTJ is electrically coupled to a first electrode of the second access transistor and a bottom layer of the second MTJ is electrically coupled to the second bit line.

DETAILED DESCRIPTION

Figure 1:
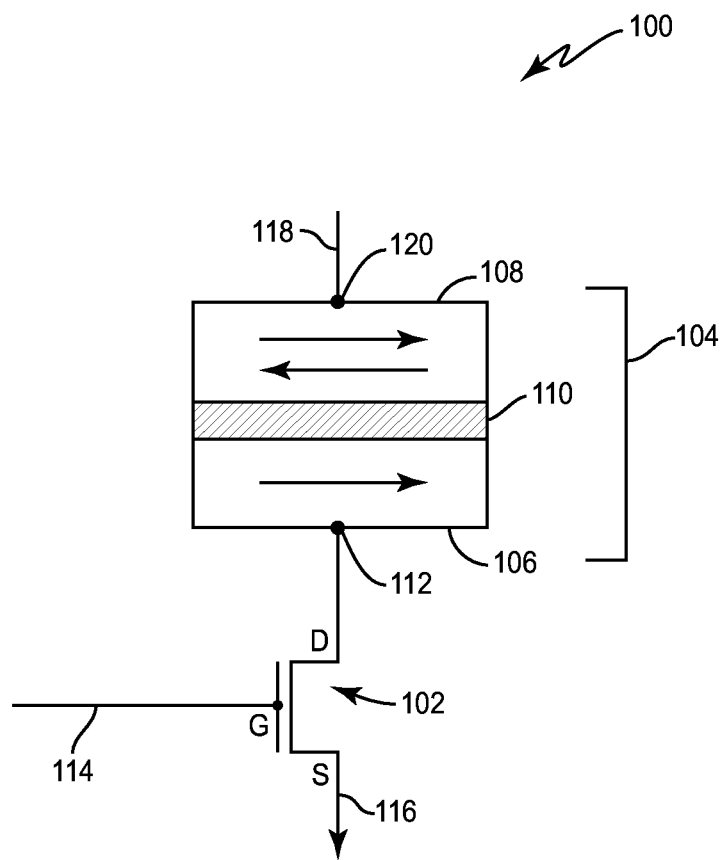
FIG. 1 is a diagram of an exemplary magnetic tunnel junction (MTJ) operatively coupled to a bit line and a source line in the prior art.
Figure 2:
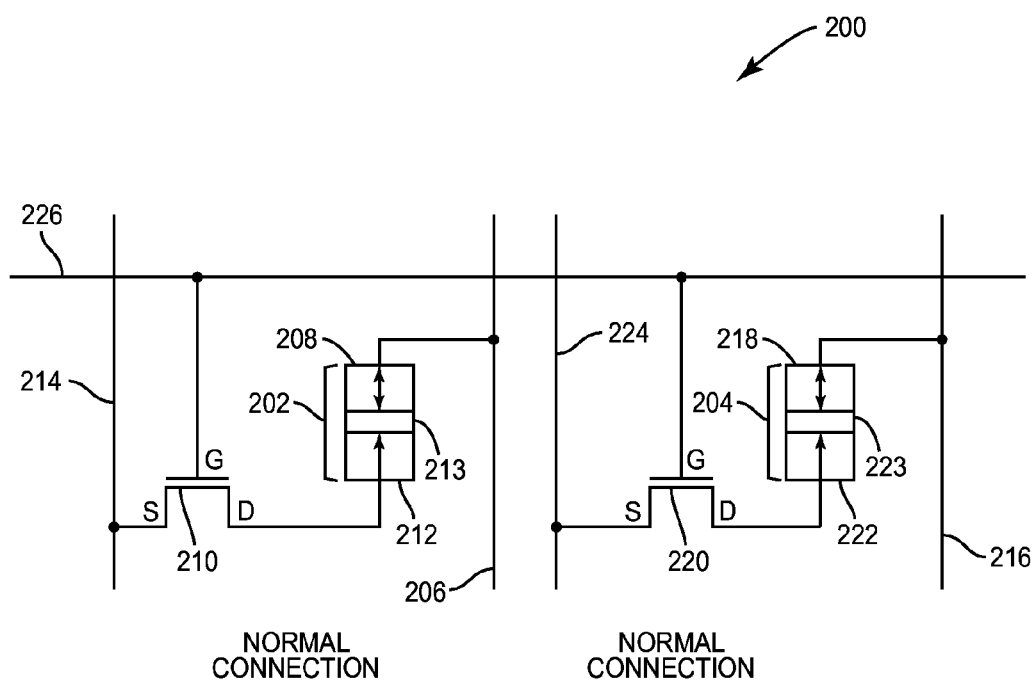
FIG. 2 is circuit diagram of a two (2) transistor, two (2) MTJ (2T2MTJ) bit cell employing two (2) bit lines and two (2) source lines in the prior art.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include reverse complement magnetic tunnel junction (MTJ) bit cells employing shared source lines, and related methods. In certain aspects disclosed herein, two (2) transistor, two (2) MTJ (2T2MTJ) reverse complement bit cells employing shared source lines are provided rather than employing separate source lines for each MTJ. Employing a single shared source line that is electrically coupled to two (2) MTJs in the 2T2MTJ reverse complement bit cell allows the shared source line to be fabricated with a larger width without increasing die size, as compared to fabricating separate source lines for a conventional 2T2MTJ bit cell. Providing a shared source line with a larger width in a 2T2MTJ bit cell reduces the parasitic resistance of the source line, as compared to a conventional 2T2MTJ bit cell, resulting in reduced read sensing times.

In this regard, in one aspect, a 2T2MTJ reverse complement bit cell employing a shared source line is provided to achieve a reduced read sensing time with a reduced parasitic resistance. The 2T2MTJ reverse complement bit cell includes a first MTJ and a second MTJ, wherein a value represented by a magnetic orientation in the first MTJ is a complement of a value represented by a magnetic orientation in the second MTJ. A first bit line is coupled to a top layer of the first MTJ, and a first electrode of a first access transistor is coupled to a bottom layer of the first MTJ. A second bit line, which is a complement of the first bit line, is coupled to a bottom layer of the second MTJ, and a first electrode of a second access transistor is coupled to a top layer of the second MTJ. Thus, the second MTJ is coupled to the second bit line and the second access transistor in a reverse manner, as compared to how the first MTJ is coupled to the first bit line and the first access transistor. A word line coupled to a second electrode of the first access transistor and a second electrode of the second access transistor is activated to access the first MTJ and the second MTJ. Further, a shared source line is coupled to a third electrode of the first access transistor and a third electrode of the second access transistor. Thus, rather than employing separate source lines for each of the first MTJ and the second MTJ, the first MTJ and the second MTJ share a single source line.

Figure 3:
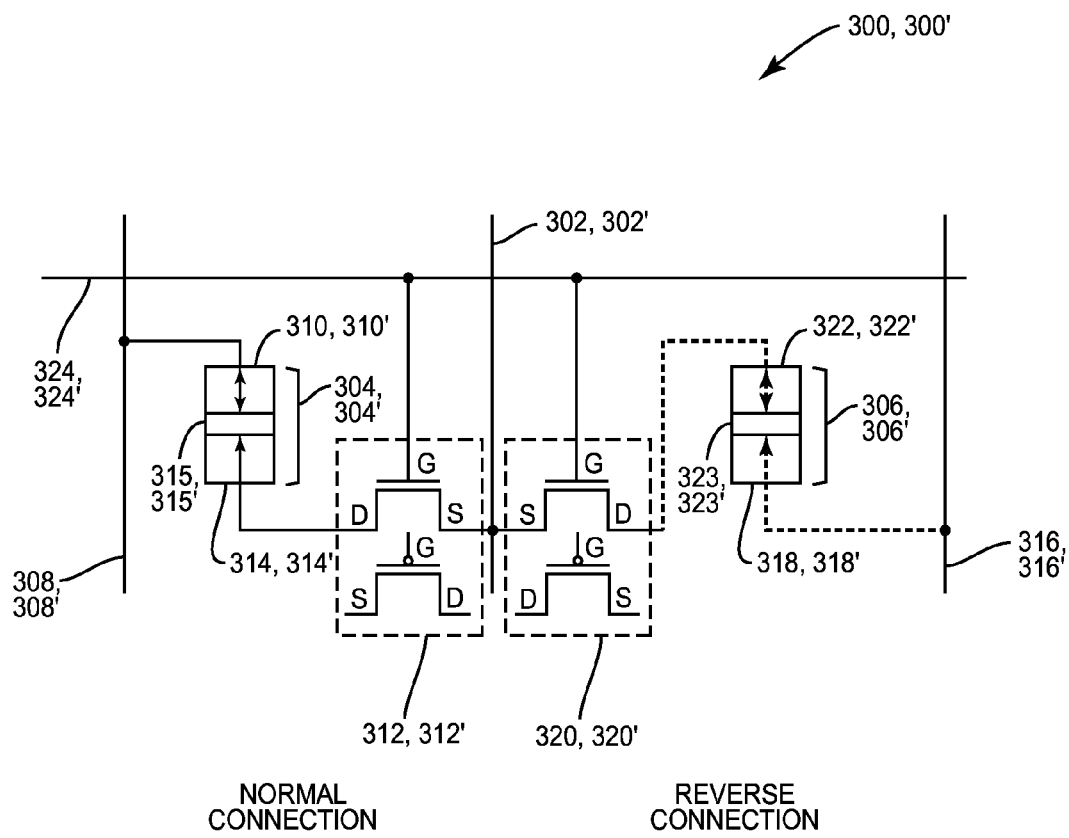
FIG. 3 is a circuit diagram of an exemplary reverse complement MTJ bit cell provided in the form of a "bottom pin" 2T2MTJ reverse complement bit cell employing a shared source line to achieve a reduced parasitic resistance, and thus, a faster read sensing time.

In this regard, FIG. 3 illustrates an exemplary reverse complement MTJ bit cell 300 employing a shared source line 302. The reverse complement MTJ bit cell 300 includes a first MTJ 304 and a second MTJ 306, wherein a value represented by a magnetic orientation in the first MTJ 304 is a complement of a value represented by a magnetic orientation in the second MTJ 306. A first bit line 308 is coupled to a top layer 310 of the first MTJ 304, and a first electrode (D) of a first access transistor 312 is coupled to a bottom layer 314 of the first MTJ 304. A tunnel barrier 315 is disposed between the top layer 310 and the bottom layer 314. A second bit line 316 is coupled to a bottom layer 318 of the second MTJ 306, wherein the second bit line 316 has a value that is a logical complement of a value on the first bit line 308. Further, a first electrode (D) of a second access transistor 320 is coupled to a top layer 322 of the second MTJ 306. A tunnel bather 323 is disposed between the top layer 322 and the bottom layer 318. Thus, the second MTJ 306 is coupled to the second bit line 316 and the second access transistor 320 in a reverse manner as compared to how the first MTJ 304 is coupled to the first bit line 308 and the first access transistor 312.

With continuing reference to FIG. 3, a word line 324 is coupled to a second electrode (G) of the first access transistor 312 and a second electrode (G) of the second access transistor 320. The word line 324 is activated to access the first MTJ 304 and the second MTJ 306. Further, the shared source line 302 is coupled to a third electrode (S) of the first access transistor 312 and a third electrode (S) of the second access transistor 320. Thus, rather than employing separate source lines, the first MTJ 304 and the second MTJ 306 share the shared source line 302. Employing the shared source line 302 coupled in this manner allows the shared source line 302 to be designed with a larger width as compared to 2T2MTJ bit cells employing a separate source line for each MTJ. Such a larger width results in the shared source line 302 having a reduced parasitic resistance. Thus, the reverse complement MTJ bit cell 300 provides an MRAM bit cell with a reduced parasitic resistance as compared to a conventional 2T2MTJ bit cell, resulting in a reduced read sensing time. Additionally, the configuration of the reverse complement MTJ bit cell 300 also allows simultaneous write operations to the first MTJ 304 and the second MTJ 306, and thus provides an increased write performance as compared to a conventional 2T2MTJ bit cell.

Notably, the first and second access transistors 312, 320 are n-type metal oxide semi-conductor (NMOS) transistors in aspects disclosed herein. Thus, the first electrode is a drain (D), the second electrode is a gate (G), and the third electrode is a source (S). However, as illustrated in FIG. 3, other aspects may employ alternative types of transistors for similar functionality, such as, but not limited to, p-type metal oxide semi-conductor (PMOS) transistors. In aspects employing PMOS transistors for the first and second access transistors 312, 320, the first electrode is a source (S), the second electrode is a gate (G), and the third electrode is a drain (D). In aspects employing PMOS transistors for the first and second access transistors 312, 320, the word line 324 is activated by a logical '0' value. However, in aspects employing NMOS transistors for the first and second access transistors 312, 320, the word line 324 is activated by a logical '1' value.

With continuing reference to FIG. 3, details of the configuration of the reverse complement MTJ bit cell 300 will now be described. In this aspect, the reverse complement MTJ bit cell 300 is a "bottom pin" 2T2MTJ reverse complement bit cell 300'. Notably, elements associated with the reverse complement MTJ bit cell 300 have an associated number "X," while similar elements in the "bottom pin" 2T2MTJ reverse complement bit cell 300' have an associated number "X'," and thus will not be re-described herein. The "bottom pin" notation describes the configuration of the first MTJ 304' as it relates to the first bit line 308' and the shared source line 302', wherein the "bottom pin" configuration is the conventional configuration of an MTJ within an MRAM bit cell. In this manner, the top layer 310' of the first MTJ 304' is employed as a free layer, while the bottom layer 314' of the first MTJ 304' is employed as a pinned layer. Because the bottom layer 314' (e.g., the pinned layer) of the first MTJ 304' is coupled to the first electrode (D) of the first access transistor 312' as previously described, the shared source line 302' is electrically coupled to the bottom layer 314' (e.g., the pinned layer) when the first access transistor 312' is activated via the word line 324'. Thus, the first bit line 308' is electrically coupled to the top layer 310' (e.g., the free layer) of the first MTJ 304'. The configuration associated with the first MTJ 304' is referred to as a "normal connection" in the "bottom pin" 2T2MTJ reverse complement bit cell 300', as this is the conventional configuration in a "bottom pin" MTJ within an MRAM bit cell.

With continuing reference to FIG. 3, the second MTJ 306' is configured in a reverse manner as compared to the "normal connection" of the first MTJ 304'. Similar to the first MTJ 304', the top layer 322' of the second MTJ 306' is employed as a free layer, while the bottom layer 318' is employed as a pinned layer. However, rather than coupling the bottom layer 318' (e.g., the pinned layer) of the second MTJ 306' to the first electrode (D) of the second access transistor 320', similar to the first MTJ 304', the bottom layer 318' is coupled to the second bit line 316'. The top layer 322' (e.g., the free layer) of the second MTJ 306' is coupled to the first electrode (D) of the second access transistor 320', causing the top layer 322' (e.g., the free layer) to be electrically coupled to the shared source line 302' when the second access transistor 320' is activated via the word line 324'. Thus, the shared source line 302' is electrically coupled to the top layer 322' (e.g., the free layer) of the second MTJ 306'. The configuration associated with the second MTJ 306' is referred to as a "reverse connection" in the "bottom pin" 2T2MTJ reverse complement bit cell 300', as this is opposite of the "normal connection" in a "bottom pin" MTJ within an MRAM bit cell. By employing the first MTJ 304' with the "normal connection" while employing the second MTJ 306' with the "reverse connection," the "bottom pin" 2T2MTJ reverse complement bit cell 300' may employ the shared source line 302' with a larger width, and thus, a reduced parasitic resistance. Therefore, the "bottom pin" 2T2MTJ reverse complement bit cell 300' provides an MRAM bit cell with a reduced parasitic resistance as compared to a conventional 2T2MTJ bit cell, resulting in a reduced read sensing time.

With continuing reference to FIG. 3, to read the "bottom pin" 2T2MTJ reverse complement bit cell 300', the word line 324' is configured to receive an enable signal (not shown) so as to activate the first and second access transistors 312', 320'. The first bit line 308' is configured to receive a first read voltage ($V_{R1}$) (not shown), and the second bit line 316' is configured to receive a second read voltage ($V_{R2}$) (not shown). Additionally, the shared source line 302' is configured to receive a shared read voltage ($V_{RS}$) (not shown). Applying the first read voltage ($V_{R1}$) to the first bit line 308' while applying the shared read voltage ($V_{RS}$) to the shared source line 302' generates a first read current ($I_{R1}$) (not shown) flowing through the first MTJ 304' from the first bit line 308' to the shared source line 302', generating a first MTJ voltage ($V_{MTJ1}$) (not shown). Similarly, applying the second read voltage ($V_{R2}$) to the second bit line 316' while applying the shared read voltage ($V_{RS}$) to the shared source line 302' generates a second read current ($I_{R2}$) (not shown) flowing through the second MTJ 306' from the second bit line 316' to the shared source line 302', generating a second MTJ voltage ($V_{MTJ2}$) (not shown). The first MTJ voltage ($V_{MTJ1}$) and the second MTJ voltage ($V_{MTJ2}$) are provided to a sensing device, such as a differential operational amplifier ("op-amp") (not shown). Such a sensing device determines the logical value represented by a magnetic orientation of the of the top layer 310' (the free layer) and the bottom layer 314' (the pinned layer) of the first MTJ 304', as well as the logical value represented by a magnetic orientation of the top layer 322' (the free layer) and the bottom layer 318" (the pinned layer) of the second MTJ 306'. In this manner, an anti-parallel (AP) magnetic orientation represents a logical '1' value, while a parallel (P) magnetic orientation represents a logical '0' value.

With continuing reference to FIG. 3, to write to the "bottom pin" 2T2MTJ reverse complement bit cell 300' the word line 324' is configured to receive the enable signal so as to activate the first and second access transistors 312', 320'. The first bit line 308' is configured to receive a first write voltage ($V_{W1}$) (not shown), and the second bit line 316' is configured to receive a second write voltage ($V_{W2}$) (not shown). Additionally, the shared source line 302' is configured to receive a shared write voltage ($V_{WS}$) (not shown). Applying the first write voltage ($V_{W1}$) to the first bit line 308' while applying the shared write voltage ($V_{WS}$) to the shared source line 302' generates a first write current ($I_{W1}$) (not shown) flowing through the first MTJ 304'. Similarly, applying the second write voltage ($V_{W2}$) to the second bit line 316' while applying the shared write voltage ($V_{WS}$) to the shared source line 302' generates a second write current ($I_{W2}$) (not shown) flowing through the second MTJ 306'. The strength of the first write current ($I_{W1}$) determines whether the top layer 310' (the free layer) of the first MTJ 304' has a magnetic orientation of AP or P to the bottom layer 314' (the pinned layer) of the first MTJ 304'. Further, the second write current ($I_{W2}$) determines whether the top layer 322' (the free layer) of the second MTJ 306' has a magnetic orientation of AP or P to the bottom layer 318' (the pinned layer) of the second MTJ 306'. In this manner, the shared source line 302' allows the first MTJ 304' and the second MTJ 306' to be written to simultaneously, thus increasing the write performance as compared to conventional 2T2MTJ bit cells employing multiple source lines.

Figure 4:
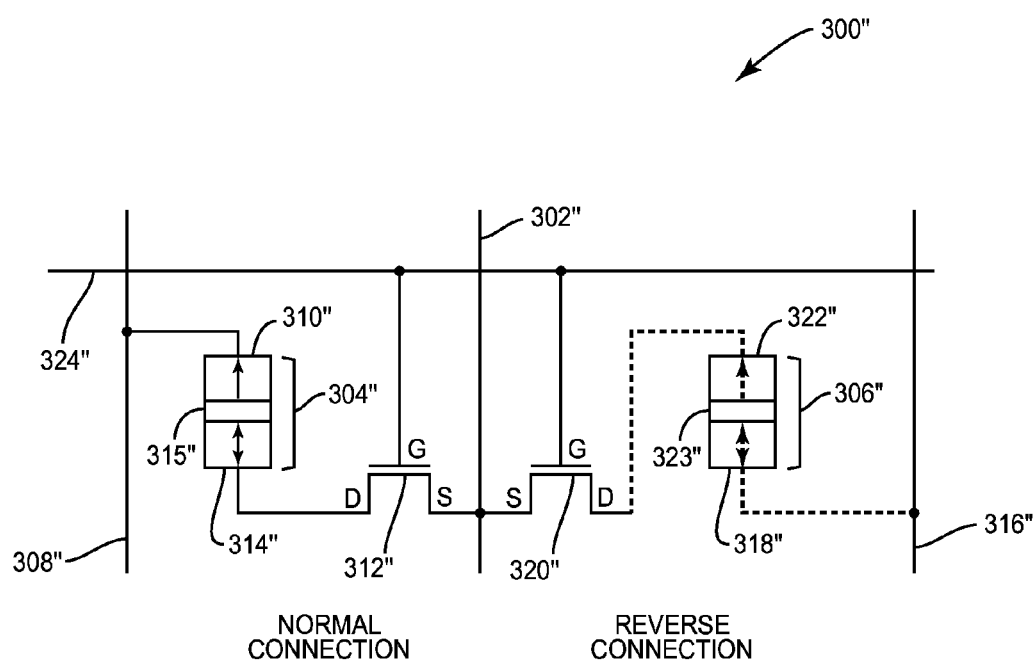
FIG. 4 is a circuit diagram of an exemplary "top pin" 2T2MTJ reverse complement bit cell employing a shared source line to achieve a reduced parasitic resistance, and thus, a faster read sensing time.

In addition to the "bottom pin" 2T2MTJ reverse complement bit cell 300' in FIG. 3, other aspects employing alternative configurations may achieve similar functionality. In this regard, FIG. 4 illustrates a "top pin" 2T2MTJ reverse complement bit cell 300" employing a shared source line 302". Notably, the "top pin" 2T2MTJ reverse complement bit cell 300" includes certain components and circuits similar to the "bottom pin" 2T2MTJ reverse complement bit cell 300' in FIG. 3. Such components that have an associated number "X'" in FIG. 3 are denoted by a number "X''" in FIG. 4, and thus will not be re-described herein.

With continuing reference to FIG. 4, the "top pin" notation describes the configuration of the first MTJ 304" as it relates to the first bit line 308" and the shared source line 302". The "top pin" configuration of an MRAM bit cell includes an MTJ having a pinned layer disposed above a tunnel barrier and a free layer. In contrast, the "bottom pin" configuration of an MRAM bit cell includes an MTJ having a free layer disposed above a tunnel barrier and a pinned layer. The "top pin" configuration is employed when more current (I) is desired for switching a magnetic orientation of a free layer from parallel (P) to anti-parallel (AP) with respect to a magnetic orientation of a pinned layer in a corresponding MTJ. In this manner, the top layer 310" of the first MTJ 304" is employed as a pinned layer, while the bottom layer 314" of the first MTJ 304" is employed as a free layer. The bottom layer 314" (e.g., the free layer) of the first MTJ 304" is coupled to the first electrode (D) of the first access transistor 312". Thus, the shared source line 302" is electrically coupled to the bottom layer 314" (e.g., the free layer) when the first access transistor 312" is activated via the word line 324". Further, the first bit line 308" is electrically coupled to the top layer 310" (e.g., the pinned layer) of the first MTJ 304". The configuration associated with the first MTJ 304" is referred to as a "normal connection" in the "top pin" 2T2MTJ reverse complement bit cell 300", which is opposite of the "normal connection" in the "bottom pin" 2T2MTJ reverse complement bit cell 300' in FIG. 3.

With continuing reference to FIG. 4, the second MTJ 306" is configured in a reverse manner as compared to the "normal connection" of the first MTJ 304". Similar to the first MTJ 304", the top layer 322" of the second MTJ 306" is employed as a pinned layer, while the bottom layer 318" is employed as a free layer. However, rather than coupling the bottom layer 318" (e.g., the free layer) of the second MTJ 306" to the first electrode (D) of the second access transistor 320", similar to the first MTJ 304", the bottom layer 318" is coupled to the second bit line 316". The top layer 322" (e.g., the pinned layer) of the second MTJ 306" is coupled to the first electrode (D) of the second access transistor 320", causing the top layer 322" (e.g., the pinned layer) to be electrically coupled to the shared source line 302" when the second access transistor 320" is activated via the word line 324". Thus, the shared source line 302" is electrically coupled to the top layer 322" (e.g., the pinned layer) of the second MTJ 306". The configuration associated with the second MTJ 306" is referred to as a "reverse connection" in the "top pin" 2T2MTJ reverse complement bit cell 300", as this is opposite of the "normal connection" in a "top pin" MTJ within an MRAM bit cell. By employing the first MTJ 304" with the "normal connection" while employing the second MTJ 306" with the "reverse connection," the "top pin" 2T2MTJ reverse complement bit cell 300" may employ the shared source line 302" with a larger width, and thus, a reduced parasitic resistance. Therefore, the "top pin" 2T2MTJ reverse complement bit cell 300" also provides an MRAM bit cell with a reduced parasitic resistance as compared to a conventional 2T2MTJ bit cell, resulting in a reduced read sensing time.

With continuing reference to FIG. 4, to read the "top pin" 2T2MTJ reverse complement bit cell 300", the word line 324" is configured to receive an enable signal (not shown) so as to activate the first and second access transistors 312", 320". The first bit line 308" is configured to receive the first read voltage ($V_{R1}$), and the second bit line 316" is configured to receive the second read voltage ($V_{R2}$). Additionally, the shared source line 302" is configured to receive the shared read voltage ($V_{RS}$). Applying the first read voltage ($V_{R1}$) to the first bit line 308" while applying the shared read voltage ($V_{RS}$) to the shared source line 302" generates the first read current ($I_{R1}$) flowing through the first MTJ 304" from the first bit line 308" to the shared source line 302", generating the first MTJ voltage ($V_{MTJ1}$). Similarly, applying the second read voltage ($V_{R2}$) to the second bit line 316" while applying the shared read voltage ($V_{RS}$) to the shared source line 302" generates the second read current ($I_{R2}$) flowing through the second MTJ 306" from the second bit line 316" to the shared source line 302", generating the second MTJ voltage ($V_{MTJ2}$). The first MTJ voltage ($V_{MTJ1}$) and the second MTJ voltage ($V_{MTJ2}$) are provided to a sensing device, such as an op-amp (not shown). Such a sensing device determines the logical value represented by a magnetic orientation of the bottom layer 314" (the free layer) and the top layer 310" (the pinned layer) of the first MTJ 304", as well as the logical value represented by a magnetic orientation of the bottom layer 318" (the free layer) and the top layer 322" (the pinned layer) of the second MTJ 306". As previously described, an AP magnetic orientation represents a logical '1' value, while a P magnetic orientation represents a logical '0' value.

With continuing reference to FIG. 4, to write to the "top pin" 2T2MTJ reverse complement bit cell 300" the word line 324" is configured to receive the enable signal so as to activate the first and second access transistors 312", 320". The first bit line 308" is configured to receive the first write voltage ($V_{W1}$), and the second bit line 316" is configured to receive the second write voltage ($V_{W2}$). Additionally, the shared source line 302" is configured to receive the shared write voltage ($V_{WS}$). Applying the first write voltage ($V_{W1}$) to the first bit line 308" while applying the shared write voltage ($V_{WS}$) to the shared source line 302" generates the first write current ($I_{W1}$) flowing through the first MTJ 304". Similarly, applying the second write voltage ($V_{W2}$) to the second bit line 316" while applying the shared write voltage ($V_{WS}$) to the shared source line 302" generates the second write current ($I_{W2}$) flowing through the second MTJ 306". The strength of the first write current ($I_{W1}$) determines whether the bottom layer 314" (the free layer) of the first MTJ 304" has a magnetic orientation of AP or P to the top layer 310" (the pinned layer) of the first MTJ 304". Further, the second write current ($I_{W2}$) determines whether the bottom layer 318" (the free layer) of the second MTJ 306" has a magnetic orientation of AP or P to the top layer 322" (the pinned layer) of the second MTJ 306". In this manner, the shared source line 302" allows the first MTJ 304" and the second MTJ 306" to be written to simultaneously, thus increasing the write performance as compared to conventional 2T2MTJ bit cells employing multiple source lines.

Figure 5:
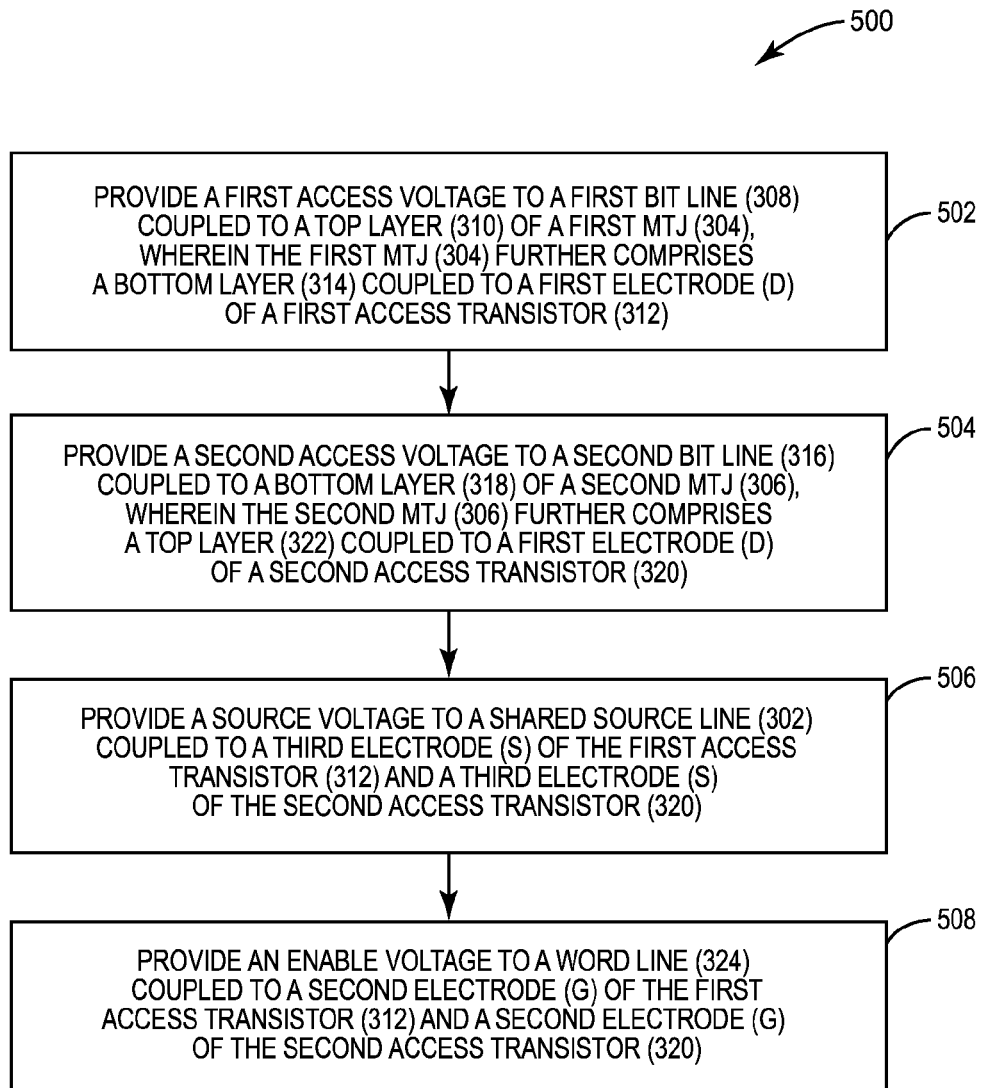
FIG. 5 is a flowchart illustrating an exemplary process for accessing the reverse complement MTJ bit cell in FIG. 3.

In this regard, FIG. 5 illustrates an exemplary process 500 for accessing the reverse complement MTJ bit cell 300 in FIG. 3. The process 500 includes providing a first access voltage to the first bit line 308 coupled to the top layer 310 of the first MTJ 304, wherein the first MTJ 304 also includes the bottom layer 314 coupled to the first electrode (D) of the first access transistor 312 (block 502). As non-limiting examples, the first access voltage may be the first read voltage or the first write voltage. The process 500 also includes providing a second access voltage to the second bit line 316 coupled to the bottom layer 318 of the second MTJ 306, wherein the second MTJ 306 also includes the top layer 322 coupled to the first electrode (D) of the second access transistor 320 (block 504). As non-limiting examples, the second access voltage may be the second read voltage or the second write voltage. The process 500 further includes providing a source voltage to the shared source line 302 coupled to the third electrode (S) of the first access transistor 312 and the third electrode (S) of the second access transistor 320 (block 506). As non-limiting examples, the source voltage may be the shared read voltage or the shared write voltage. The process 500 further includes providing an enable voltage to the word line 324 coupled to the second electrode (G) of the first access transistor 312 and the second electrode (G) of the second access transistor 320 (block 508). Accessing the reverse complement MTJ bit cell 300 using the process 500 allows for reading and writing the reverse complement MTJ bit cell 300 using the shared source line 302, wherein the shared source line 302 is designed with a larger width as compared to 2T2MTJ bit cells employing a separate source line for each MTJ. Such a larger width results in the shared source line 302 having a reduced parasitic resistance. Thus, the reverse complement MTJ bit cell 300 provides an MRAM bit cell with a reduced parasitic resistance as compared to a conventional 2T2MTJ bit cell, resulting in a reduced read sensing time. Notably, the reduced parasitic resistance results in a further reduction of the read sensing time as compared to a conventional 2T2MTJ bit cell. Additionally, as previously described, the configuration of the reverse complement MTJ bit cell 300 also allows simultaneous write operations to the first MTJ 304 and the second MTJ 306, and thus, provides an increased write performance.

Figure 6:
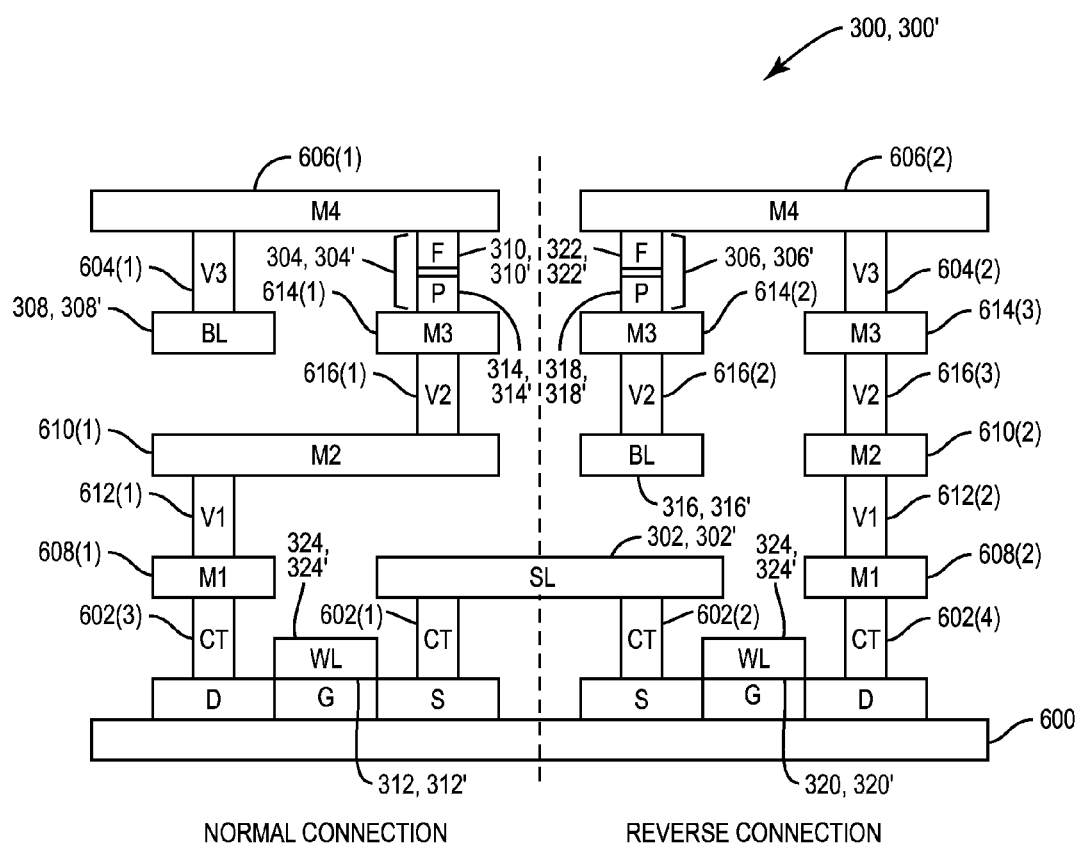
FIG. 6 is a cross-sectional diagram of the "bottom pin" 2T2MTJ reverse complement bit cell in FIG. 3.

To provide further clarification, FIG. 6 illustrates an exemplary cross-sectional view of the reverse complement MTJ bit cell 300 in FIG. 3. In this aspect, the "bottom pin" 2T2MTJ reverse complement bit cell 300' is illustrated and described in parallel with the reverse complement MTJ bit cell 300, wherein element numbers for the "bottom pin" 2T2MTJ reverse complement bit cell 300' are placed in parenthesis in the discussion of FIG. 6 below. As previously described, in the "bottom pin" 2T2MTJ reverse complement bit cell 300' the top layer 310' of the first MTJ 304' employs a free layer, while the bottom layer 314' of the first MTJ 304' employs a pinned layer. Further, the top layer 322' of the second MTJ 306' employs a free layer, and the bottom layer 318' of the second MTJ 306' employs a pinned layer.

With continuing reference to FIG. 6, the reverse complement MTJ bit cell 300 (300') includes the first MTJ 304 (304') and the second MTJ 306 (306'). The first access transistor 312 (312') and the second access transistor 320 (320') are formed on a substrate 600. The word line 324 (324') is disposed so as to be electrically coupled to the second electrode (G) of the first access transistor 312 (312') and the second electrode (G) of the second access transistor 320 (320'). The shared source line 302 (302') is disposed in a first metal layer (metal one (M1)) so as to be electrically coupled to the third electrode (S) of the first access transistor 312 (312') and the third electrode (S) of the second access transistor 320 (320') by way of contacts 602(1), 602(2), respectively. The first bit line 308 (308') is disposed in a third metal layer (metal three (M3)) so as to be electrically coupled to the top layer 310 (310') (e.g., the free layer in the "bottom pin" 2T2MTJ reverse complement bit cell 300') of the first MTJ 304 (304'). In this aspect, the first bit line 308 (308') is coupled to the top layer 310 (310') by way of a via 604(1) and a segment 606(1) of a fourth metal layer (metal four (M4)). Further, the bottom layer 314 (314') of the first MTJ 304 (304') is electrically coupled to the first electrode (D) of the first access transistor 312 (312'). In this aspect, such electrical coupling is achieved by: coupling the first electrode (D) of the first access transistor 312 (312') to a segment 608(1) of the first metal layer (M1) by way of a contact 602(3), coupling the segment 608(1) to a segment 610(1) of a second metal layer (metal two (M2)) by way of a via 612(1), coupling the segment 610(1) to a segment 614(1) of the third metal layer (M3) by way of a via 616(1), and coupling the segment 614(1) to the bottom layer 314 (314').

With continuing reference to FIG. 6, the second bit line 316 (316') is disposed in the second metal layer (M2) so as to be coupled to the bottom layer 318 (318') of the second MTJ 306 (306'). In this aspect, the second bit line 316 (316') is coupled to the bottom layer 318 (318') (e.g., the pinned layer in the "bottom pin" 2T2MTJ reverse complement bit cell 300') by way of a via 616(2) and a segment 614(2) of the third metal layer (M3). Further, the top layer 322 (322') of the second MTJ 306 (306') is electrically coupled to the first electrode (D) of the second access transistor 320 (320'). In this aspect, such electrical coupling is achieved by: coupling the first electrode (D) of the second access transistor 320 (320') to a segment 608(2) of the first metal layer (M1) by way of a contact 602(4), coupling the segment 608(2) to a segment 610(2) of the second metal layer (M2) by way of a via 612(2), coupling the segment 610(2) to a segment 614(3) of the third metal layer (M3) by way of a via 616(3), coupling the segment 614(3) to a segment 606(2) by way of a via 604(2), and coupling the segment 606(2) to the top layer 322 (322') of the second MTJ 306 (306'). Notably, while the first, second, third, and fourth metal layers are employed in M1, M2, M3, and M4, respectively, in this aspect, other aspects may employ the first, second, third, and fourth metal layers in alternative metals. As previously described, employing the shared source line 302 (302') coupled in this manner allows the shared source line 302 (302') to be designed with a larger width as compared to 2T2MTJ bit cells employing a separate source line for each MTJ. Such a larger width results in the shared source line 302 (302') having a reduced parasitic resistance. Thus, as previously described, the reverse complement MTJ bit cell 300 (300') provides an MRAM bit cell with a reduced parasitic resistance as compared to a conventional 2T2MTJ bit cell, resulting in a reduced read sensing time.

Figure 7:
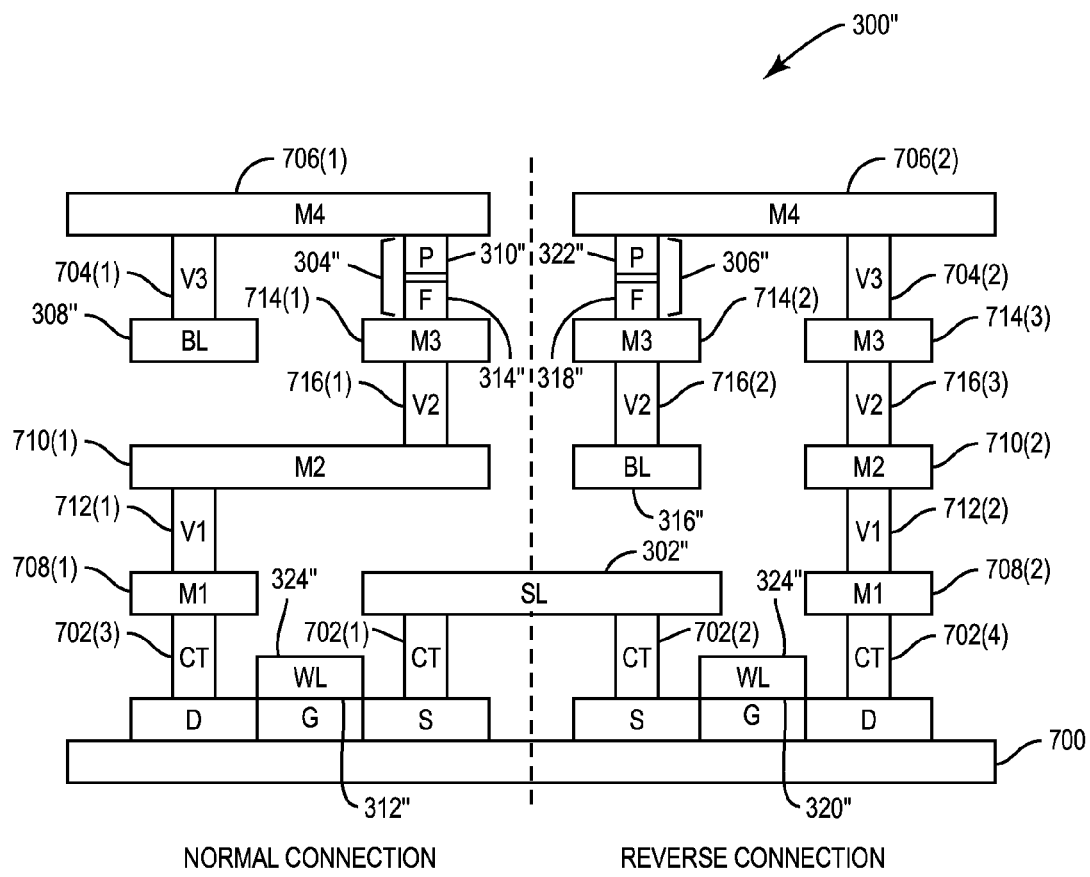
FIG. 7 is a cross-sectional diagram of the "top pin" 2T2MTJ reverse complement bit cell in FIG. 4.

In this regard, FIG. 7 illustrates an exemplary cross-sectional view of the "top pin" 2T2MTJ reverse complement bit cell 300" in FIG. 4. The "top pin" 2T2MTJ reverse complement bit cell 300" includes the first MTJ 304" and the second MTJ 306". The first access transistor 312" and the second access transistor 320" are formed on a substrate 700. The word line 324" is disposed so as to be electrically coupled to the second electrode (G) of the first access transistor 312" and the second electrode (G) of the second access transistor 320". The shared source line 302" is disposed in the first metal layer (M1) so as to be electrically coupled to the third electrode (S) of the first access transistor 312" and the third electrode (S) of the second access transistor 320" by way of contacts 702(1), 702(2), respectively. The first bit line 308" is disposed in the third metal layer (M3) so as to be electrically coupled to the top layer 310" of the first MTJ 304", wherein the top layer 310" is the pinned layer. In this aspect, the first bit line 308" is coupled to the top layer 310" by way of a via 704(1) and a segment 706(1) of the fourth metal layer (M4). Further, the bottom layer 314" of the first MTJ 304" is electrically coupled to the first electrode (D) of the first access transistor 312", wherein the bottom layer 314" is the free layer. In this aspect, such electrical coupling is achieved by: coupling the first electrode (D) of the first access transistor 312" to a segment 708(1) of the first metal layer (M1) by way of a contact 702(3), coupling the segment 708(1) to a segment 710(1) of the second metal layer (M2) by way of a via 712(1), coupling the segment 710(1) to a segment 714(1) of the third metal layer (M3) by way of a via 716(1), and coupling the segment 714(1) to the bottom layer 314" of the first MTJ 304".

With continuing reference to FIG. 7, the second bit line 316" is disposed in the second metal layer (M2) so as to be electrically coupled to the bottom layer 318" of the second MTJ 306", wherein the bottom layer 318" is the free layer. In this aspect, the second bit line 316" is coupled to the bottom layer 318" by way of a via 716(2) and a segment 714(2) of the third metal layer (M3). Further, the top layer 322" of the second MTJ 306" is electrically coupled to the first electrode (D) of the second access transistor 320", wherein the top layer 322" is the pinned layer. In this aspect, such electrical coupling is achieved by: coupling the first electrode (D) of the second access transistor 320" to a segment 708(2) of the first metal layer (M1) by way of a contact 702(4), coupling the segment 708(2) to a segment 710(2) of the second metal layer (M2) by way of a via 712(2), coupling the segment 710(2) to a segment 714(3) of the third metal layer (M3) by way of a via 716(3), and coupling the segment 714(3) to a segment 706(2) of the fourth metal layer (M4) by way of a via 704(2), and coupling the segment 706(2) to the top layer 322" of the second MTJ 306". Notably, while the first, second, third, and fourth metal layers are employed in M1, M2, M3, and M4, respectively, in this aspect, other aspects may employ the first, second, third, and fourth metal layers in alternative metals. As previously described, employing the shared source line 302" coupled in this manner allows the shared source line 302" to be designed with a larger width as compared to 2T2MTJ bit cells employing a separate source line for each MTJ. Such a larger width results in the shared source line 302" having a reduced parasitic resistance. Thus, as previously described, the "top pin" 2T2MTJ reverse complement bit cell 300" provides an MRAM bit cell with a reduced parasitic resistance as compared to a conventional 2T2MTJ bit cell, resulting in a reduced read sensing time.

Figure 8:
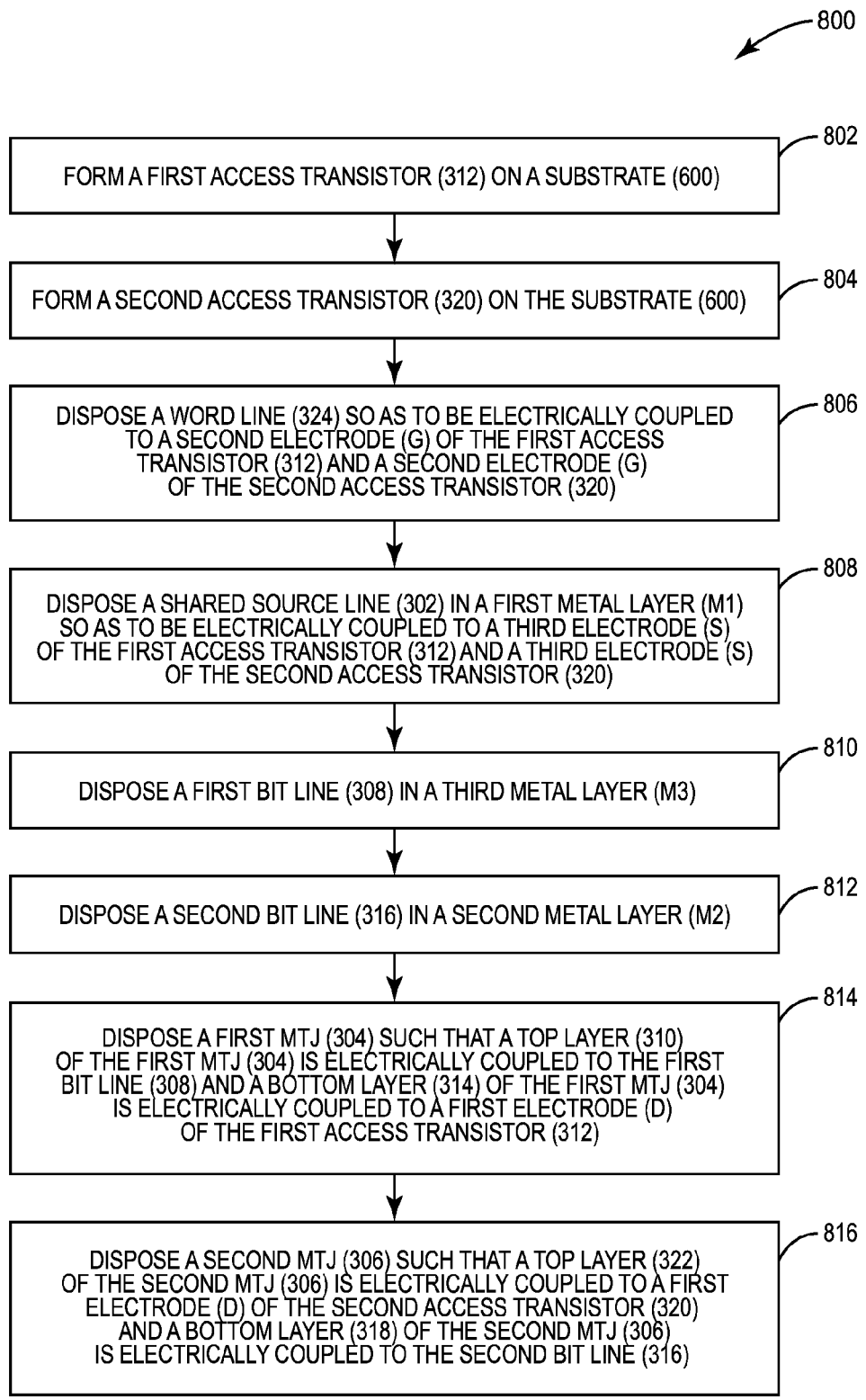
FIG. 8 is a flowchart illustrating an exemplary process for manufacturing the reverse complement MTJ bit cell in FIG. 3, wherein the reverse complement MTJ bit cell may be the "bottom pin" 2T2MTJ or the "top pin" 2T2MTJ reverse complement bit cells in FIGS. 6 and 7, respectively.

In this regard, FIG. 8 illustrates an exemplary process 800 for manufacturing the reverse complement MTJ bit cell 300 in FIG. 6. The process 800 includes forming the first access transistor 312 on the substrate 600 (block 802). The process 800 also includes forming the second access transistor 320 on the substrate 600 (block 804). Additionally, the process 800 includes disposing the word line 324 so as to be electrically coupled to the second electrode (G) of the first access transistor 312 and the second electrode (G) of the second access transistor 320 (block 806). The process 800 also includes disposing the shared source line 302 in the first metal layer (M1) so as to be electrically coupled to the third electrode (S) of the first access transistor 312 and the third electrode (S) of the second access transistor 320 (block 808). Further, the process 800 includes disposing the first bit line 308 in the third metal layer (M3) (block 810). The process 800 also includes disposing the second bit line 316 in a second metal layer (M2) (block 812). The process 800 also includes disposing the first MTJ 304 such that the top layer 310 of the first MTJ 304 is electrically coupled to the first bit line 308 and the bottom layer 314 of the first MTJ 304 is electrically coupled to the first electrode (D) of the first access transistor 312 (block 814). Further, the process 800 includes disposing the second MTJ 306 such that the top layer 322 of the second MTJ 306 is electrically coupled to the first electrode (D) of the second access transistor 320 and the bottom layer 318 of the second MTJ 306 is electrically coupled to the second bit line 316 (block 816). Manufacturing the reverse complement MTJ bit cell 300 using the process 800 allows the shared source line 302 to be designed with a larger width as compared to 2T2MTJ bit cells employing a separate source line for each MTJ. Such a larger width results in the shared source line 302 having a reduced parasitic resistance. Thus, the reverse complement MTJ bit cell 300 provides an MRAM bit cell with a reduced parasitic resistance as compared to a conventional 2T2MTJ bit cell, resulting in a reduced read sensing time.

With continuing reference to FIG. 8, as previously described, to provide the "bottom pin" 2T2MTJ reverse complement bit cell 300' in FIG. 6 using the process 800, the top layer 310' of the first MTJ 304' employs a free layer, while the bottom layer 314' of the first MTJ 304' employs a pinned layer. Further, the top layer 322' of the second MTJ 306' employs a free layer, and the bottom layer 318' of the second MTJ 306' employs a pinned layer. Alternatively, to provide the "top pin" 2T2MTJ reverse complement bit cell 300" in FIG. 7 using the process 800, the top layer 310" of the first MTJ 304" employs a pinned layer, while the bottom layer 314" of the first MTJ 304" employs a free layer. Additionally, the top layer 322" of the second MTJ 306" employs a pinned layer, and the bottom layer 318" of the second MTJ 306" employs a free layer. Notably, although the "bottom pin" 2T2MTJ reverse complement bit cell 300' and the "top pin" 2T2MTJ reverse complement bit cell 300" have different configurations, a reduction in parasitic resistance similar to the reverse complement MTJ bit cell 300 may be achieved in both.

Figure 9:
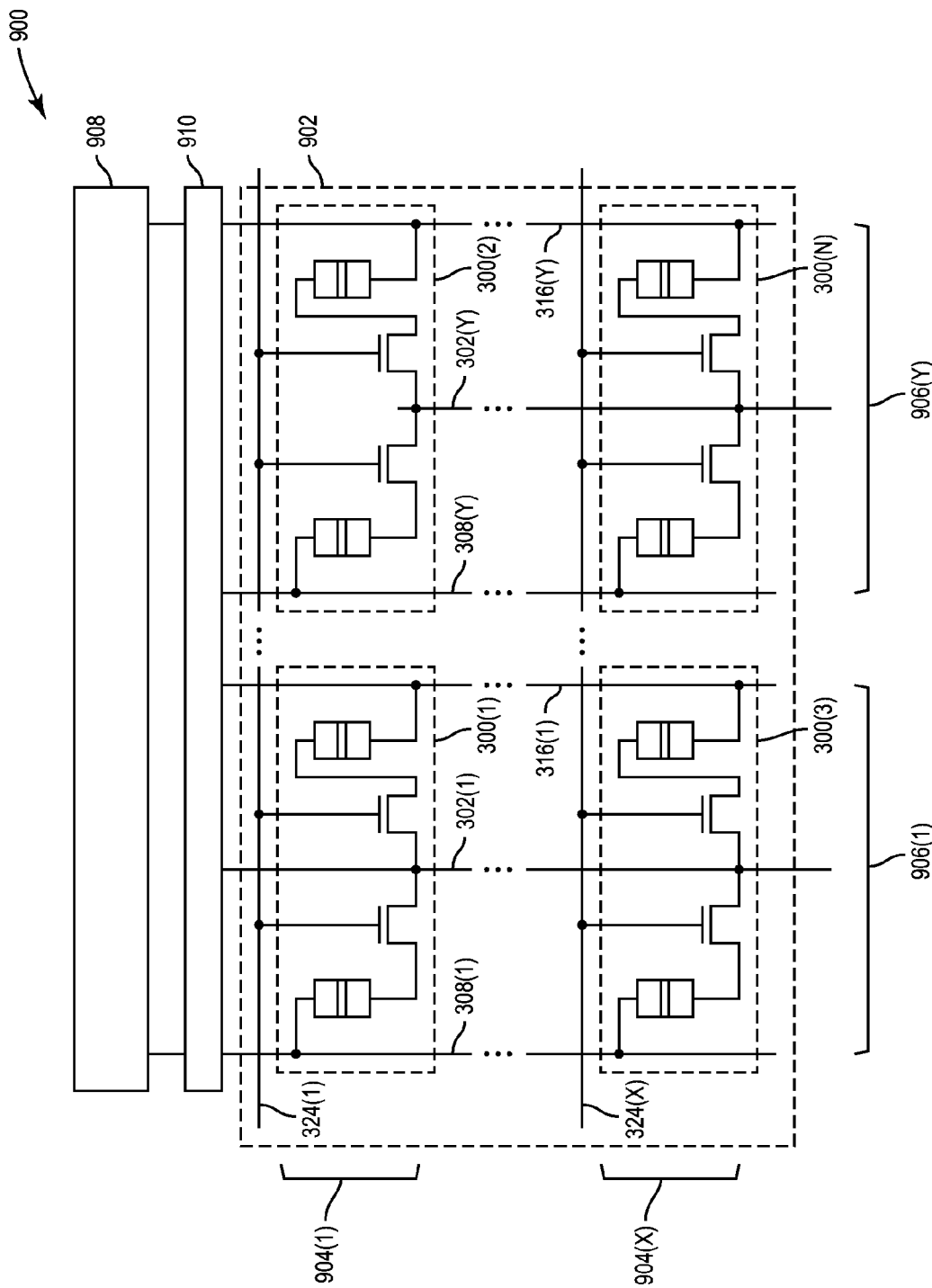
FIG. 9 is a circuit diagram of an exemplary magnetic random access memory (MRAM) system employing the "bottom pin" 2T2MTJ reverse complement bit cell in FIG. 3.

Additionally, the reverse complement MTJ bit cell 300 in FIGS. 3 and 6 may be employed in a memory system. In this regard, FIG. 9 illustrates an exemplary MRAM system 900 employing multiple reverse complement MTJ bit cells 300 (1)-300(N) in an MRAM array 902. Notably, the elements of the reverse complement MTJ bit cells 300(1)-300(N) are similar to the elements of the reverse complement MTJ bit cell 300 in FIG. 3, and thus are not re-described herein. Further, the reverse complement MTJ bit cells 300(1)-300(N) may include either "bottom pin" 2T2MTJ reverse complement bit cells 300'(1)-300'(N) or "top pin" 2T2MTJ reverse complement bit cells 300"(1)-300" (N). The reverse complement MTJ bit cells 300(1)-300(N) in the MRAM array 902 are divided into rows 904(1)-904(X) and columns 906(1)-906(Y). The MRAM system 900 also includes a write driver 908 and a multiplexer 910. The write driver 908 is configured to provide a write current ($I_W$) (not shown) that is used to read or write a reverse complement MTJ bit cell 300(1)-300(N) located in one of the rows 904(1)-904(X) corresponding to the activated word line 324(1)-324(X). The particular reverse complement MTJ bit cell 300 in the selected row 904(1)-904(X) on which the read or write operation is performed corresponds to the column 906(1)-906(Y) that is selected by the multiplexer 910. Thus, the write driver 908 is configured to provide the write current ($I_W$) to the first bit line 308(1)-308(Y), the second bit line 316(1)-316(Y), or the shared source line 302(1)-302(Y) of the selected reverse complement MTJ bit cell 300(1)-300(N) according to the read or write operation to be completed.

The reverse complement MTJ bit cells employing shared source lines according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
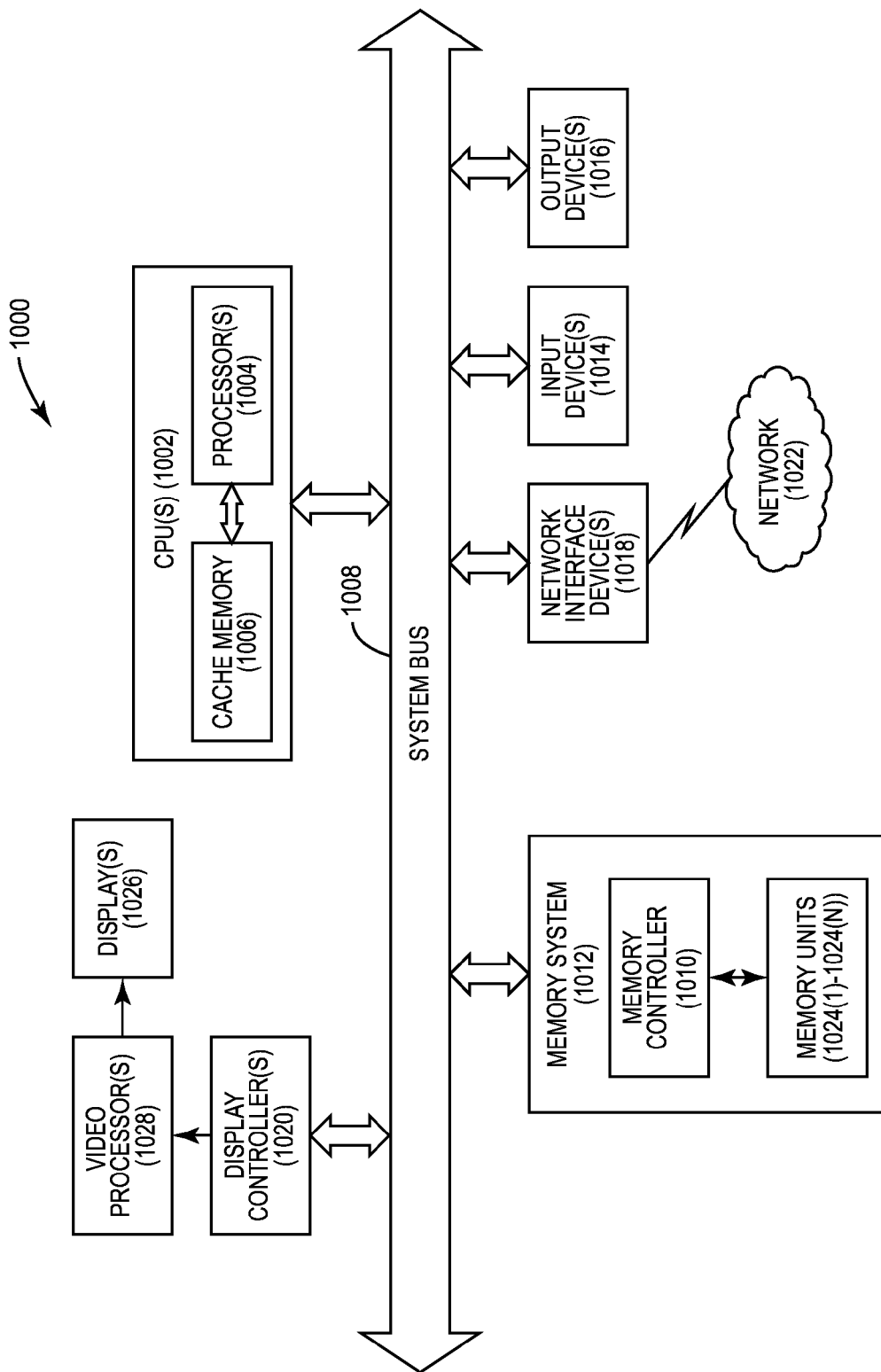
FIG. 10 is a block diagram of an exemplary processor-based system that can include the reverse complement MTJ bit cell in FIG. 3, wherein the reverse complement MTJ bit cell may be the "bottom pin" 2T2MTJ and the "top pin" 2T2MTJ reverse complement bit cells in FIGS. 3 and 4, respectively.

In this regard, FIG. 10 illustrates an example of a processor-based system 1000 that can employ the reverse complement MTJ bit cells 300 illustrated in FIGS. 3 and 6, such as the "bottom pin" reverse complement bit cells 300' illustrated in FIGS. 3 and 6, and the "top pin" reverse complement bit cells 300" illustrated in FIGS. 4 and 7. In this example, the processor-based system 1000 includes one or more central processing units (CPUs) 1002, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012, one or more input devices 1014, one or more output devices 1016, one or more network interface devices 1018, and one or more display controllers 1020, as examples. The input device(s) 1014 can include any type of input device, including but not limited to input keys, switches, voice processors, etc. The output device(s) 1016 can include any type of output device, including but not limited to audio, video, other visual indicators, etc. The network interface device(s) 1018 can be any device configured to allow exchange of data to and from a network 1022. The network 1022 can be any type of network, including but not limited to a wired or wireless network, a private or public network, a local area network (LAN), a wireless local area network (WLAN), a wide area network (WAN), a BLUETOOTH™ network, or the Internet. The network interface device(s) 1018 can be configured to support any type of communications protocol desired. The memory system 1012 can include one or more memory units 1024(1)-1024(N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. An access transistor may be an NMOS transistor, a PMOS transistor, or any other type of transistor.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A reverse complement magnetic tunnel junction (MTJ) bit cell, comprising:
    a first MTJ;
    a second MTJ;
    a first electrode of a first access transistor coupled to a bottom layer of the first MTJ;
    a first electrode of a second access transistor coupled to a top layer of the second MTJ;
    a word line coupled to a second electrode of the first access transistor and a second electrode of the second access transistor;
    a first bit line coupled to a top layer of the first MTJ;
    a second bit line coupled to a bottom layer of the second MTJ; and
    a shared source line coupled to a third electrode of the first access transistor and a third electrode of the second access transistor.

2. The reverse complement MTJ bit cell of claim 1, wherein the reverse complement MTJ bit cell comprises a two (2) transistor, two (2) MTJ (2T2MTJ) reverse complement bit cell.

3. The reverse complement MTJ bit cell of claim 1, wherein:
    the first bit line is configured to receive a first read voltage;
    the second bit line is configured to receive a second read voltage; and
    the shared source line is configured to receive a shared read voltage.

4. The reverse complement MTJ bit cell of claim 1, wherein:
    the first bit line is configured to receive a first write voltage;
    the second bit line is configured to receive a second write voltage; and
    the shared source line is configured to receive a shared write voltage.

5. The reverse complement MTJ bit cell of claim 1, wherein:
    the top layer of the first MTJ comprises a free layer of the first MTJ;
    the bottom layer of the first MTJ comprises a pinned layer of the first MTJ;
    the top layer of the second MTJ comprises a free layer of the second MTJ; and
    the bottom layer of the second MTJ comprises a pinned layer of the second MTJ.

6. The reverse complement MTJ bit cell of claim 1, wherein:
    the top layer of the first MTJ comprises a pinned layer of the first MTJ;
    the bottom layer of the first MTJ comprises a free layer of the first MTJ;
    the top layer of the second MTJ comprises a pinned layer of the second MTJ; and
    the bottom layer of the second MTJ comprises a free layer of the second MTJ.

7. The reverse complement MTJ bit cell of claim 1, wherein the first access transistor comprises an n-type metal oxide semiconductor (NMOS) transistor, and wherein:
    the first electrode of the first access transistor comprises a drain;
    the second electrode of the first access transistor comprises a gate; and
    the third electrode of the first access transistor comprises a source.

8. The reverse complement MTJ bit cell of claim 1, wherein the second access transistor comprises an n-type metal oxide semiconductor (NMOS) transistor, and wherein:
    the first electrode of the second access transistor comprises a drain;
    the second electrode of the second access transistor comprises a gate; and
    the third electrode of the second access transistor comprises a source.

9. The reverse complement MTJ bit cell of claim 1, wherein the first access transistor comprises a p-type metal oxide semiconductor (PMOS) transistor, and wherein:
    the first electrode of the first access transistor comprises a source;
    the second electrode of the first access transistor comprises a gate; and
    the third electrode of the first access transistor comprises a drain.

10. The reverse complement MTJ bit cell of claim 1, wherein the second access transistor comprises a p-type metal oxide semiconductor (PMOS) transistor, and wherein:
    the first electrode of the second access transistor comprises a source;
    the second electrode of the second access transistor comprises a gate; and
    the third electrode of the second access transistor comprises a drain.

11. The reverse complement MTJ bit cell of claim 1 integrated into an integrated circuit (IC).

12. The reverse complement MTJ bit cell of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

13. A method for accessing a reverse complement magnetic tunnel junction (MTJ) bit cell, comprising:
    providing a first access voltage to a first bit line coupled to a top layer of a first MTJ, wherein the first MTJ further comprises a bottom layer coupled to a first electrode of a first access transistor;
    providing a second access voltage to a second bit line coupled to a bottom layer of a second MTJ, wherein the second MTJ further comprises a top layer coupled to a first electrode of a second access transistor;
    providing a source voltage to a shared source line coupled to a third electrode of the first access transistor and a third electrode of the second access transistor; and
    providing an enable voltage to a word line coupled to a second electrode of the first access transistor and a second electrode of the second access transistor.

14. The method of claim 13, wherein accessing the reverse complement MTJ bit cell comprises reading the reverse complement MTJ bit cell, wherein:
- providing the first access voltage comprises providing a first read voltage to the first bit line;
- providing the second access voltage comprises providing a second read voltage to the second bit line; and
- providing the source voltage comprises providing a shared read voltage to the shared source line.

15. The method of claim 13, wherein accessing the reverse complement MTJ bit cell comprises writing the reverse complement MTJ bit cell, wherein:
- providing the first access voltage comprises providing a first write voltage to the first bit line;
- providing the second access voltage comprises providing a second write voltage to the second bit line; and
- providing the source voltage comprises providing a shared write voltage to the shared source line.

16. A reverse complement magnetic tunnel junction (MTJ) bit cell, comprising:
- a first MTJ;
- a second MTJ;
- a first access transistor formed on a substrate, the first access transistor comprising a first electrode electrically coupled to a bottom layer of the first MTJ;
- a second access transistor formed on the substrate, the second access transistor comprising a first electrode electrically coupled to a top layer of the second MTJ;
- a word line disposed so as to be electrically coupled to a second electrode of the first access transistor and to a second electrode of the second access transistor;
- a first bit line disposed in a third metal layer so as to be electrically coupled to a top layer of the first MTJ;
- a second bit line disposed in a second metal layer so as to be electrically coupled to a bottom layer of the second MTJ; and
- a shared source line disposed in a first metal layer so as to be electrically coupled to a third electrode of the first access transistor and a third electrode of the second access transistor.

17. The reverse complement MTJ bit cell of claim 16, wherein the reverse complement MTJ bit cell comprises a two (2) transistor, two (2) MTJ (2T2MTJ) reverse complement bit cell.

18. The reverse complement MTJ bit cell of claim 16, wherein:
- the top layer of the first MTJ comprises a free layer of the first MTJ;
- the bottom layer of the first MTJ comprises a pinned layer of the first MTJ;
- the top layer of the second MTJ comprises a free layer of the second MTJ; and
- the bottom layer of the second MTJ comprises a pinned layer of the second MTJ.

19. The reverse complement MTJ bit cell of claim 16, wherein:
- the top layer of the first MTJ comprises a pinned layer of the first MTJ;
- the bottom layer of the first MTJ comprises a free layer of the first MTJ;
- the top layer of the second MTJ comprises a pinned layer of the second MTJ; and
- the bottom layer of the second MTJ comprises a free layer of the second MTJ.

20. The reverse complement MTJ bit cell of claim 16, wherein the first metal layer is comprised of metal one (M1).

21. The reverse complement MTJ bit cell of claim 16, wherein the second metal layer is comprised of metal two (M2).

22. The reverse complement MTJ bit cell of claim 16, wherein the third metal layer is comprised of metal three (M3).

23. The reverse complement MTJ bit cell of claim 16, wherein the first access transistor comprises an n-type metal oxide semi-conductor (NMOS) transistor, and wherein:
- the first electrode of the first access transistor comprises a drain;
- the second electrode of the first access transistor comprises a gate; and
- the third electrode of the first access transistor comprises a source.

24. The reverse complement MTJ bit cell of claim 16, wherein the second access transistor comprises an n-type metal oxide semi-conductor (NMOS) transistor, and wherein:
- the first electrode of the second access transistor comprises a drain;
- the second electrode of the second access transistor comprises a gate; and
- the third electrode of the second access transistor comprises a source.

25. The reverse complement MTJ bit cell of claim 16 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

26. A method of manufacturing a reverse complement magnetic tunnel junction (MTJ) bit cell, comprising:
- forming a first access transistor on a substrate;
- forming a second access transistor on the substrate;
- disposing a word line so as to be electrically coupled to a second electrode of the first access transistor and a second electrode of the second access transistor;
- disposing a shared source line in a first metal layer such that the shared source line is electrically coupled to a third electrode of the first access transistor and a third electrode of the second access transistor;
- disposing a first bit line in a third metal layer;
- disposing a second bit line in a second metal layer;
- disposing a first MTJ such that a top layer of the first MTJ is electrically coupled to the first bit line and a bottom layer of the first MTJ is electrically coupled to a first electrode of the first access transistor; and
- disposing a second MTJ such that a top layer of the second MTJ is electrically coupled to a first electrode of the second access transistor and a bottom layer of the second MTJ is electrically coupled to the second bit line.

27. The method of claim 26, wherein:
- disposing the first MTJ comprises disposing the first MTJ such that the top layer of the first MTJ comprises a free layer;
- disposing the first MTJ comprises disposing the first MTJ such that the bottom layer of the first MTJ comprises a pinned layer;

disposing the second MTJ comprises disposing the second MTJ such that the top layer of the second MTJ comprises a free layer; and disposing the second MTJ comprises disposing the second MTJ such that the bottom layer of the second MTJ comprises a pinned layer.

28. The method of claim 26, wherein:

disposing the first MTJ comprises disposing the first MTJ such that the top layer of the first MTJ comprises a pinned layer;

disposing the first MTJ comprises disposing the first MTJ such that the bottom layer of the first MTJ comprises a free layer;

disposing the second MTJ comprises disposing the second MTJ such that the top layer of the second MTJ comprises a pinned layer; and disposing the second MTJ comprises disposing the second MTJ such that the bottom layer of the second MTJ comprises a free layer.

* * * * *